United States Patent [19]

Okuno et al.

[11] Patent Number: 5,232,651
[45] Date of Patent: Aug. 3, 1993

[54] METHOD OF SEALING ELECTRIC PARTS MOUNTED ON ELECTRIC WIRING BOARD WITH RESIN COMPOSITION

[75] Inventors: Atsushi Okuno, Takatsuki; Tsunekazu Hashimoto, Shiga; Koichiro Nagai, Higashiosaka; Masajiro Inoue, Nagaokakyo, all of Japan

[73] Assignee: Japan Rec Co., Ltd., Takatsuki, Japan

[21] Appl. No.: 624,440

[22] Filed: Dec. 10, 1990

[30] Foreign Application Priority Data

Dec. 11, 1989 [JP] Japan .................. 1-322221
Oct. 2, 1990 [JP] Japan .................. 2-265831

[51] Int. Cl.⁵ .................. B29C 39/28; B29C 67/08
[52] U.S. Cl. .................. 264/251; 264/272.14; 264/272.15; 264/276
[58] Field of Search .......... 264/212, 272.14, 272.15, 264/272.17, 279, 272.11, 251, 264, 276, 328.9

[56] References Cited

U.S. PATENT DOCUMENTS

| | | | |
|---|---|---|---|
| 1,989,702 | 2/1935 | Leguillon | 425/219 |
| 2,724,864 | 11/1955 | Krotz | 264/276 |
| 3,384,931 | 5/1968 | Cochran et al. | 264/272.15 |
| 4,264,549 | 4/1981 | Utner | 264/272.15 |
| 4,336,009 | 6/1982 | Wolf | 264/276 |

FOREIGN PATENT DOCUMENTS 64-82639  3/1989  Japan .

Primary Examiner—Jan H. Silbaugh
Assistant Examiner—Angela Ortiz
Attorney, Agent, or Firm—Armstrong, Westerman, Hattori, McLeland & Naughton

[57] ABSTRACT

A method of sealing electric parts mounted in a bare state on an electric wiring board uses a liquid sealing resin as a printing ink and a screen serving as screen printing means and having apertures in the same pattern as the electric parts mounted on the board. The lower end of a peripheral wall of the screen defining each of the apertures is substantially brought into line-to-line contact with the surface of the board for screen printing. The screen has a recess formed on the rear side of the line contact portion thereof and surrounding the contact portion. These features prevent the printing ink from adhering to the rear side of the screen and the collapse of the sealing resin layer that would occur if the ink adheres to the screen rear sides.

4 Claims, 7 Drawing Sheets

METHOD OF SEALING ELECTRIC PARTS MOUNTED ON ELECTRIC WIRING BOARD WITH RESIN COMPOSITION

TECHNICAL FIELD

The present invention relates to a method of sealing electric parts mounted on the surface of electric wiring boards with resin composition, and more particularly to a method of sealing electric parts mounted in a bare state on the boards with resin composition by screen printing means.

BACKGROUND ART

With an increase in the complexity of arrangement of parts mounted on the surface of electric wiring boards, for example, of printed circuit boards, electric parts such as integrated semiconductor devices are mounted in a bare state directly on printed boards and electrically connected thereto. In this case, the electric parts mounted in a bare state on the printed board must be sealed with an electrically insulating resin mainly so as to retain their quality.

Figure 10:
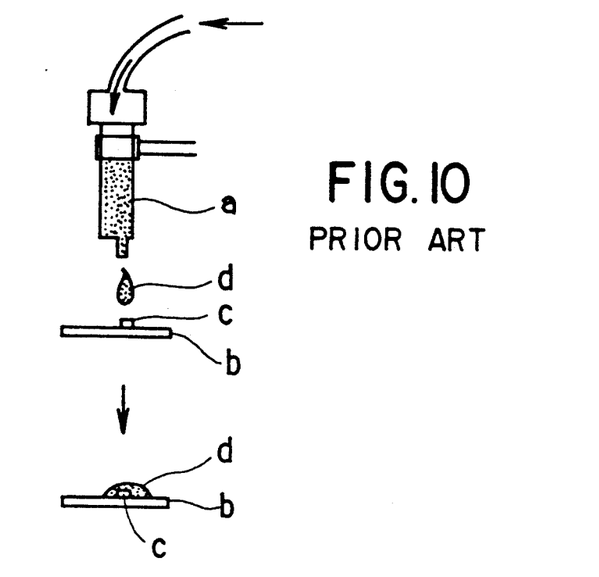
FIG. 10 is a diagram showing a conventional dispenser method.

As such a method of sealing electric parts with resin, the so-called potting method has already been proposed wherein a pneumatically operable dispenser a is used for applying a liquid sealing resin d dropwise onto an electric part c mounted on a printed board b to seal the part as shown in FIG. 10. The potting method has the problems to be described below with reference to FIGS. 11 and 12.

Figure 12:
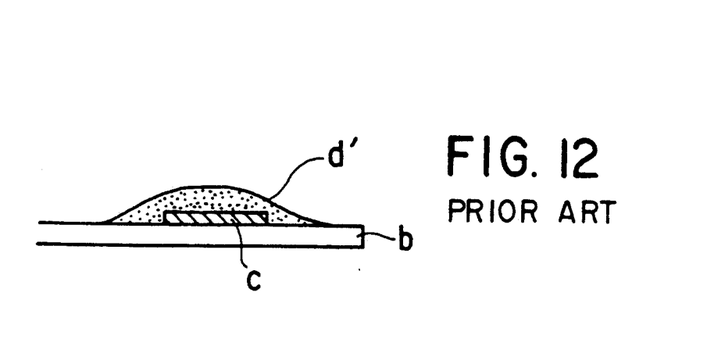
FIG. 12 is a view in vertical section of the same.

(1) As seen in FIG. 12, the resin portion d' sealing the electric part c appears convex in shape, has a thickness which is largest at the center and gradually decreases toward the outer periphery, and therefore fails to produce a uniform sealing effect.

Figure 11:
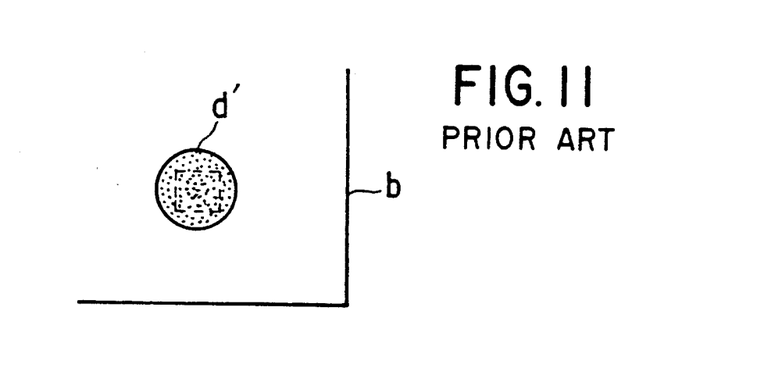
FIG. 11 is a plan view schematically showing a part as sealed with resin by the method.

(2) The part c is usually square to rectangular, whereas the sealing resin portion d' is circular as shown in FIG. 11, so that the part c must be sealed over an excessive area. This is not desirable in view of the high complexity of the arrangement on the board.

(3) Although the amount of resin d to be applied dropwise can be suitably determined according to the size of the part c, the resin d applied is difficult to control in thickness.

(4) For application to LSIs or like large-scale electric parts, the resin d must be applied dividedly several times. It is then difficult to give a uniform appearance and a uniform thickness to the sealing resin layer to be formed. The part therefore can not be sealed effectively with good stability.

(5) The method is low in productivity since parts c must be sealed individually one by one.

(6) When the resin is to be applied to the next part after application to one part, cobwebbing of the resin is liable to occur. The thread of resin is then likely to soil the printed board b.

We have already proposed a method of sealing electric parts mounted on the surface of electric wiring boards with resin using screen printing means (see, for example, Unexamined Japanese Patent Publication No.82639/1989). All the foregoing problems (1) to (6) involved in the potting method can be overcome by this method which employs the screen printing means.

The proposed sealing method with use of the screen printing means employs a screen having apertures in the same pattern as the electric parts mounted on the board and is practiced by forcing a liquid sealing resin serving as the printing ink into a space formed between each of the apertures and the part registered therewith by the operation of a squeegee to fill the space and seal the part. However, when the printing cycle is repeated many times, the liquid sealing resin serving as the printing ink adheres to the rear side of the screen, and the resin portion adhering to the rear side is printed on the surface of the board in the form of a thin overflow portion around the sealing resin layer, consequently collapsing the resin layer slightly as will be described below in detail.

Further when the liquid sealing resin is forcibly filled into the screen aperture by operating the squeegee, the amount of resin filled in is larger toward the end side of stroke of the squeegee than toward the starting side of the stroke. The uneven amount of resin filled in gives an uneven thickness to the sealing resin layer and results in reduced productivity as will be described in detail later.

DISCLOSURE OF THE INVENTION

An object of the present invention is to seal electric parts mounted in a bare state on an electric wiring board with resin using screen printing means without permitting printing of an overflow resin portion that would lead to a collapse of the sealing resin layer formed.

Another object of the invention is to force a liquid sealing resin into each aperture of a screen by the operation of a squeegee to fill the resin into the aperture in an amount which is substantially uniform from the squeegee stroke starting side to the stroke end side thereof so as to give a uniform thickness to the resulting sealing resin layer and achieve improved productivity.

Other features of the present invention will become apparent from the following description.

The present invention provides a method of sealing electric parts mounted in a bare state on an electric wiring board with a liquid sealing resin with use of a screen having apertures in the same pattern as the electric parts mounted on the board by forcing the resin in a liquid state into a space formed between each of the apertures and the part registered therewith through the aperture by the operation of a squeegee to fill the space, the method being characterized in that the lower end of the peripheral wall of the screen defining the aperture is substantially brought into line-to-line contact with the surface of the board, and that the line contact portion of the screen is formed at the back side thereof with a recess surrounding the contact portion.

According to the present invention, the sealing method described above is further characterized by moving a doctor knife from the squeegee stroke end side of the screen aperture to an intermediate portion of the aperture in contact with the screen subsequent to the operation of the squeegee for filling the liquid sealing resin into the space to thereby render the space filled with the resin substantially uniformly from the stroke starting side of the aperture to the stroke end side thereof, and thereafter retracting the screen from the board to complete transfer of the sealing resin from the screen to the board.

Examples of liquid sealing resins serviceable as printing inks for use in the present invention are resin compositions predominantly containing a resin such as silicone resin, epoxy resin, phenol resin, acrylic resin, acrylic epoxy resin, acrylic polyester resin, urethane resin or polybutadiene resin, and various other known resin compositions which are used in the art. A preferred liquid sealing resin is, for example, a single-pack epoxy resin composition consisting essentially of a liquid epoxy resin, a curing agent which is the reaction product of an aromatic diamine and a quaternary phosphonium salt, a flame retardant and an inorganic filler. The viscosity of the sealing resin is preferably in the range of 200 to 20000 poises at room temperature. When having a higher viscosity, the resin is difficult to forcibly fill into the screen aperture, whereas if the resin has a lower viscosity, the sealing resin layer formed will encounter difficulty in retaining its shape until it cures. Thus, the viscosities outside the above range are not desirable.

Useful screens are mainly those made of an aluminum alloy, copper, nickel or stainless steel and further include those made of plastics. The screen has apertures formed in the same pattern as the electric parts mounted on an electric wiring board and to be sealed.

The thickness of the screen must be larger than that of the electric parts to be sealed and is determined suitable usually from the range of from 0.1 to 5.0 mm in accordance with the thickness of the electric parts to be sealed.

The apertures are formed usually by etching. Each aperture is similar to the corresponding electric part in configuration when seen from above and has a larger size than the part. When the aperture is in register with the electric part, a space required for sealing is formed around the part in the aperture.

The peripheral wall of the screen defining the aperture has its lower end substantially brought into line-to-line contact with the surface of the board. The screen is formed at the back side of the line contact portion with an annular recess surrounding the contact portion. The line contact portion and the annular recess surrounding this portion can be provided by forming in the rear side of the screen the annular recess which caves in upward from the rear side around the aperture. The width of the recess, if excessively large, is likely to warp or undulate the screen and must therefore be a minimum. The width is suitably determined usually from the range of about 1 to about 5 mm as will be described in detail later.

The line contact of the lower end of the screen aperture defining a peripheral wall with the surface of the board and the annular recess surrounding the line contact portion prevent the adhesion of the printing ink to the rear side of the screen that would otherwise occur.

Further according to the present invention, a doctor knife is moved from the squeegee stroke end side of the screen aperture to an intermediate portion of the aperture in contact with the screen surface subsequent to the operation of the squeegee for filling the liquid sealing resin into the aperture. Consequently, a raised excessive portion of the liquid sealing resin at the stroke end side is forcibly returned to the intermediate portion of the aperture, whereby the amount of resin filling the aperture is made substantially uniform from the stroke starting side to the stroke end side. This diminishes the amount of cobwebbing of the resin that will occur below the aperture.

When the screen is retracted to complete the transfer of the liquid sealing resin from the aperture to the board, thereby shortening the time taken for the thread of resin to break to achieve improved productivity. Furthermore, cobwebbing occurs at the intermediate portion of the aperture, so that the threadlike portion of the resin, upon breaking, is absorbed and collected by the intermediate portion of the sealing resin layer transferred to the board and thereafter flows toward opposite sides to form a smooth surface. As a result, a uniform thickness can be given to the sealing resin layer despite the absorption of the broken threadlike portion of the resin.

The aperture defining wall surface can be treated with fluorine or the like to permit the resin to flow smoothly therealong and thereby shorten the time taken for the resin thread to break.

Examples of electric parts mounted in a bare state on electric wiring boards and to be sealed by the method of the invention are integrated semiconductor devices, resistors, photocouplers, capacitors, sensors, transistors, thyristors, diodes, transformers, varistors, operational amplifiers, filters, windings, switches, relays, etc. Integrated semiconductor devices include, in addition to SSI, MIS, LSI, VLSI, photosemiconductors, compound semiconductors, Josephson devices and like single components, complex devides such as hybrid ICs and IC cards.

Such electric parts can be mounted on boards, for example, by the wire bonding method, TAB method, HLIP chip method or soldering method.

BEST MODE OF CARRYING OUT THE INVENTION

The mode of practicing the present invention will be described below with reference to the accompanying drawings.

Figure 1:
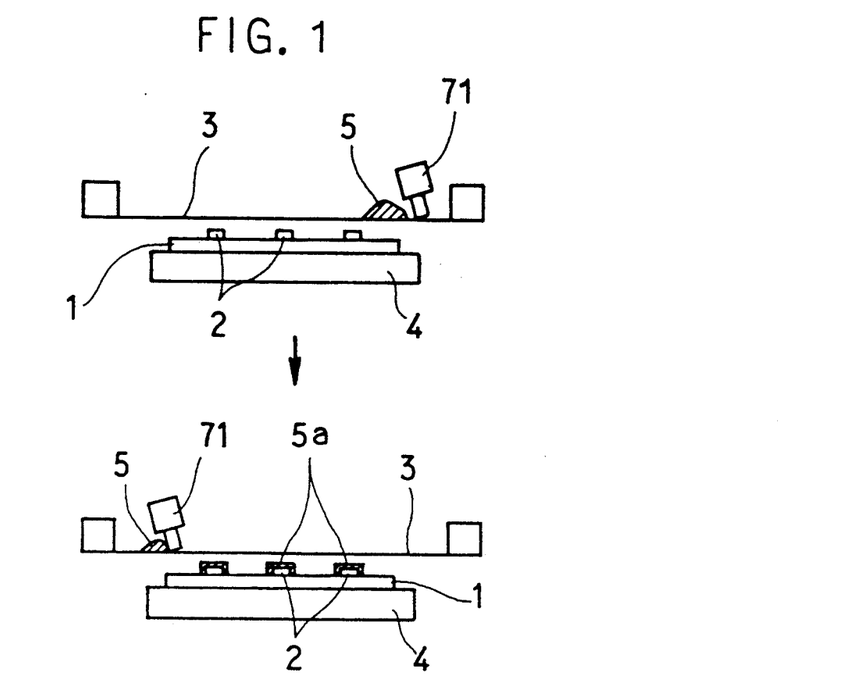
FIG. 1 schematically shows the sealing method of the invention as practiced stepwise.
Figure 2A:
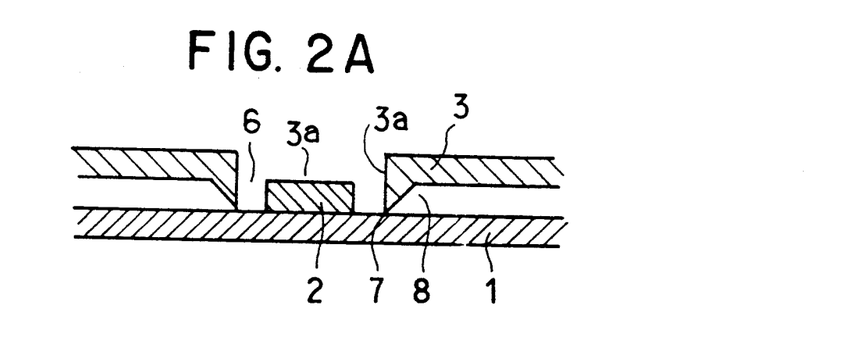
FIG. 2A is an enlarged fragmentary diagram showing an aperture in a screen as registered with an electric part on a board in the sealing method of the invention.

The screen printing means for use in the method of the invention will be described with reference to FIGS.

1 and 2A. In FIGS. 1 and 2A, a printed board 1 has a multiplicity of bare electric parts 2 mounted thereon. On the other hand, a screen 3 has a pattern of apertures identical with the pattern of parts 2 mounted.

The upper diagram of FIG. 1 shows a first step, in which the screen 3 is fixed in place on a screen printing press (not shown), and the board 1 is fixed to a slide table 4 of the printing press. Further a liquid sealing resin 5 is supplied in a predetermined amount to a specified position on the screen 3. Subsequently, the printing press is operated to register the apertures 3a (see FIG. 2A) of the screen 3 with the electric parts 2 on the board 1 and press the screen 3 against the board 1. The screen 3 as pressed against the board 1 is shown on an enlarged scale in FIG. 2A. A space 6 necessary for sealing each part 2 is formed in the aperture 3a around the part 2 accommodated therein.

In the second step shown in the lower diagram of FIG. 1, the liquid sealing resin 5 is forced into the space 6 through the aperture 3a to fill the space by operating a squeegee 71. After the space 6 or the aperture 3a has been thus filled, the printing press is operated to retract the screen 3 to the initial position, whereby the electric part 2 is sealed with a resin layer 5a.

In the case where the sealing resin layer is formed by printing using the screen printing means, cobwebbing of the liquid resin occurs at the apertured portion when the screen is retracted, and after the cobweb or thread of the resin breaks, the lower portion of the thread is absorbed by the sealing resin layer on contraction, and the upper portion thereof by the liquid resin portion adhering to and remaining on the apertured portion. If the screen is flat over the entire area of its rear side in this case like the conventional one, the liquid resin portion to be absorbed by the apertured portion on contraction partly adheres to the rear side of the screen at the lower end of the aperture and is consequently printed around the sealing resin layer as an overflow. The principle of this phenomenon will be described below with reference to FIG. 5B.

Figure 5A:
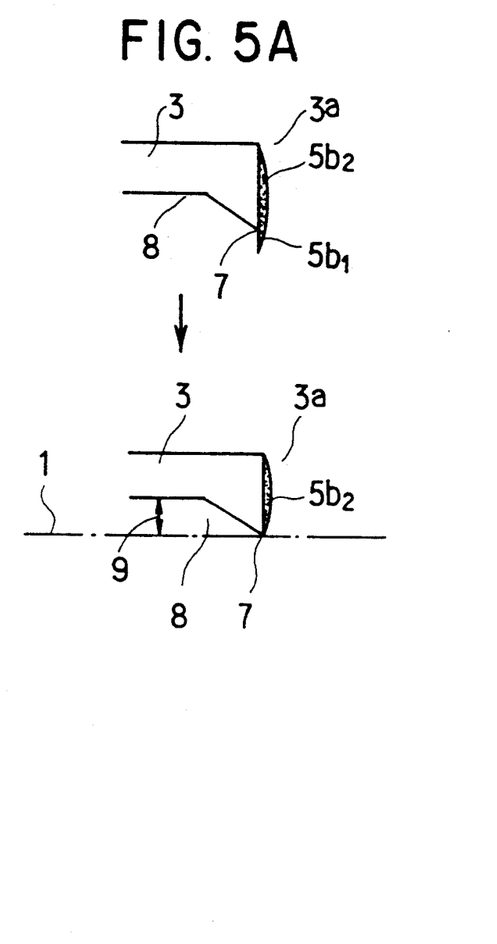
FIG. 5A includes diagrams for illustrating the principle of preventing printing ink from adhering to the rear side of the screen according to the method of the invention.
Figure 5B:
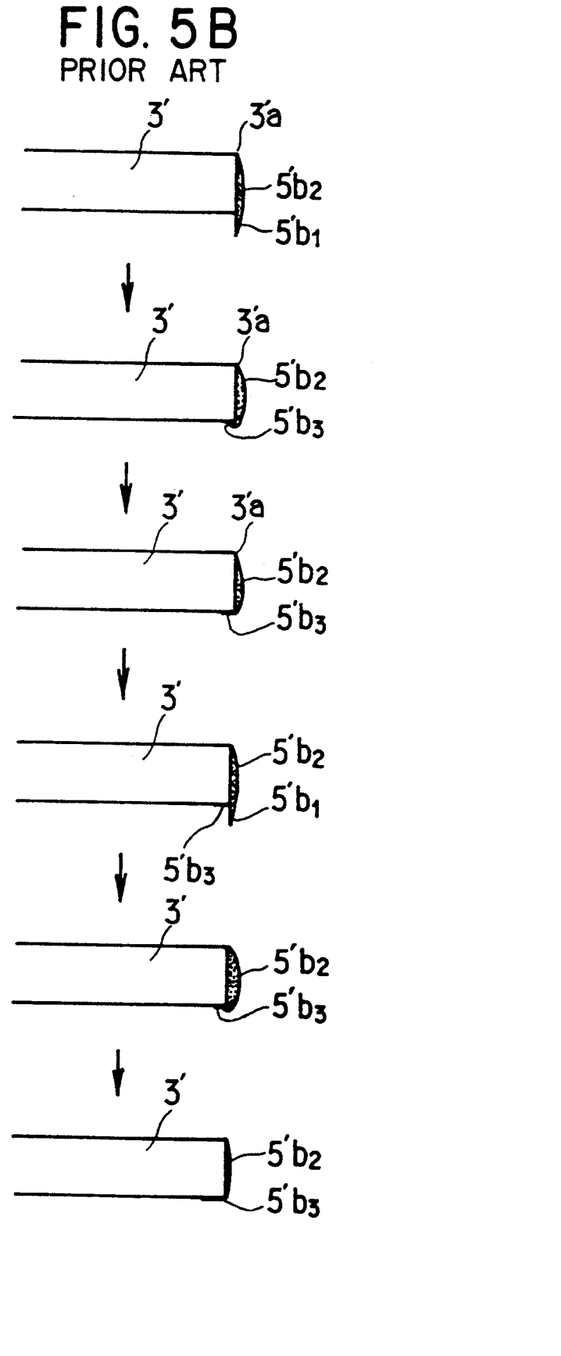
FIG. 5B includes diagrams for illustrating the principle of adhesion of printing ink to the rear side of a screen according to a conventional method.

The first diagram of FIG. 5B shows a thread of resin immediate after a break. When the broken threadlike portion 5'b1 of resin is absorbed by the resin portion 5'b2 adhering to and remaining on the peripheral wall of the apertured portion 3'a upon contracting from the illustrated state, the threadlike resin portion partly adheres to the rear side of the screen 3' as shown in the second diagram. During the next printing cycle, the resin portion 5'b3 adhering to the rear side comes into contact with the surface of the board (not shown) and is collapsed to spread as shown in the third diagram. In the following printing cycle, a thread is formed again as shown in the fourth diagram. Upon the thread breaking, the resulting resin portion partly adheres to the rear side of the screen 3' in the same manner as above to increase the amount of the resin portion 5'b3 on the rear side. These phenomena are thereafter repeated to increase the amount of the rear-side resin portion.

Figure 5C:
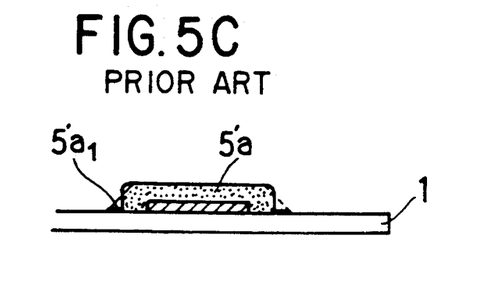
FIG. 5C is an enlarged view in vertical section schematically showing a sealing resin layer as collapsed by the adhesion of printing ink to the rear side.

FIG. 5C shows a sealing layer 5'a as formed by the conventional method. As seen in FIG. 5C, an overflow portion 5'a1 is printed around the lower end of the resin layer 5'a owing to the adhesion of liquid resin to the rear side of the screen 3'. Since the resin layer 5'a has the same composition as the overflow portion 5'a1 and is compatible therewith, the shoulder of the resin layer 5'a tends to flow outward toward the lower overflow portion 5'a1 owing to a difference in level during curing following printing, collapsing the resin layer to result in impaired dimensional accuracy as indicated in a phantom line in the drawing.

To overcome the above problem, the screen 3 of the present invention is adapted to come into line-to-line contact with the surface of the board at the lower end of the peripheral wall defining each aperture 3a of the screen 3, and a recessed portion 8 is formed around the line contact portion 7 at the back side thereof. The adhesion of the liquid resin to the rear side of the screen 3 can be prevented by the line contact portion 7 and the recessed portion 8. This will be described below with reference to FIG. 5A.

The upper diagram of FIG. 5A corresponds to the first diagram of FIG. 5B and shows a threadlike resin portion 5b1 upon a thread breaking. This portion contracts from the illustrated state and is absorbed by a resin portion 5b2 adhering to and remaining on the peripheral wall defining the aperture 3a. According to the present invention, the lower end of the peripheral wall defining the aperture 3a is so shaped as to come into line-to-line contact with the surface of the board. For example, it is shaped with an acute angle as illustrated. A recessed portion 8 is formed around the line contact portion at the back side thereof. Accordingly, the threadlike resin portion 5b1 is nearly entirely absorbed on contract by the resin portion 5b2 adhering to and remaining on the apertured portion 3a almost without adhering to the rear side of the screen 3. This results in reduction or removal of resin on the rear side of the screen 3.

Further at the back side of the line contact portion 7, the rear side of the screen 3 is at a distance 9 from the surface of the board 1 during screen printing as shown in the lower diagram of FIG. 5A. This obviates the likelihood that a portion of the resin, if adhering to the rear side, will be printed on the board surface.

Figure 3:
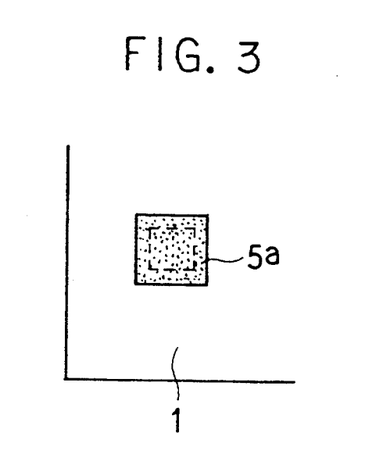
FIG. 3 is a plan view schematically showing the electric part as sealed with resin by the method of the invention.
Figure 4:
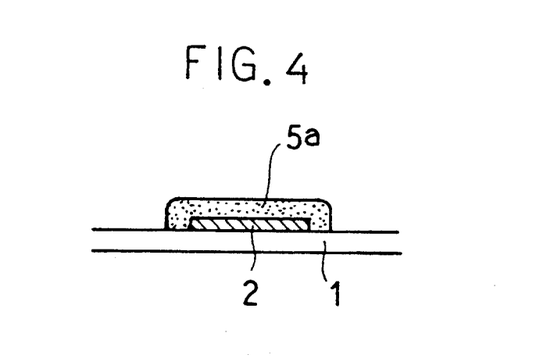
FIG. 4 is a side elevation in vertical section showing the same.

With use of the method of the present invention, therefore, no overflow resin portion will be printed with the sealing resin layer 5a as joined therewith even if the printing cycle is repeated many times as shown schematically in FIGS. 3 and 4, with the result that the sealing resin layer 5a having no overflow portion can be printed on the surface of boards 1 as positioned as specified repeatedly and reliably with good stability using the screen printing means. When having an overflow portion, the sealing resin layer 5a formed by screen printing partly flows toward the overflow portion gradually and collapses due to the interfacial tension until the layer cures, whereas when having no overflow portion, the resin layer remains in shape reliably with good stability until it cures. Thus, the sealing resin layer 5a can be printed with the specified dimensions.

Figure 6:
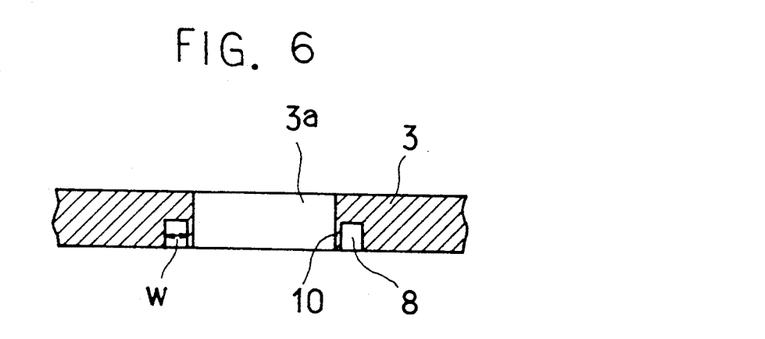
FIG. 6 to 8 are fragmentary views in section showing modified screens for use in the method of the invention.
Figure 7:
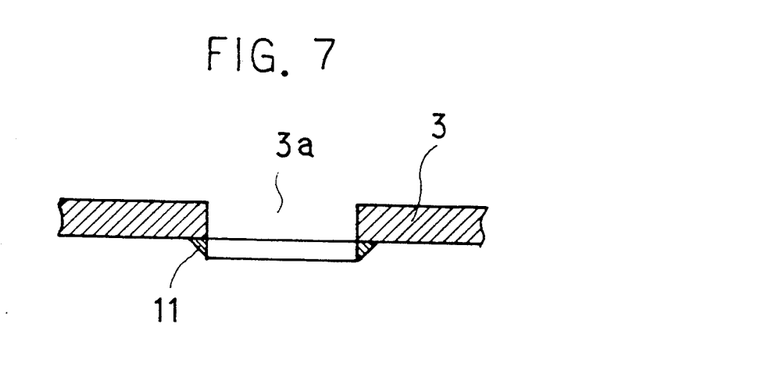
Figure 8:
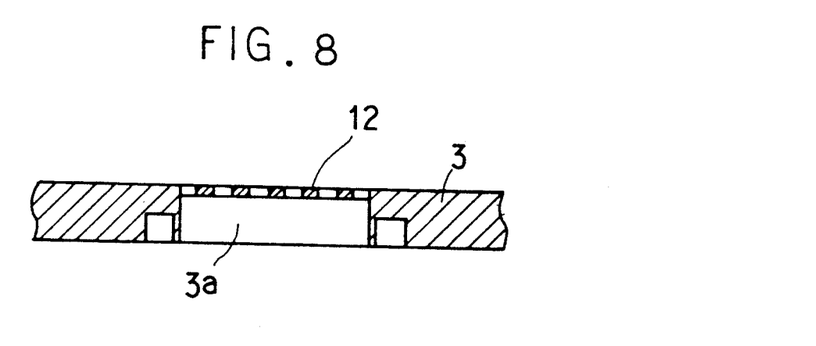

FIGS. 6 to 8 shows various modified screens 3 for use in the method the invention.

The screen 3 shown in FIG. 6 is in the form of a single sheet of a metal such as stainless steel and has an aperture 3a and a recessed portion 8 which are formed by etching. The etching treatment is conducted once. The aperture 3a is formed by etching the sheet from both the front and rear sides thereof, while the recessed portion 8 is formed by etching the rear side to a depth of one-half of the thickness of the screen 3. In the case where the recessed portion 8 is formed in the rear side of the screen 3 by etching, the recessed portion, if occupying an excessively large area, is liable to warp or undulate the screen 3, so that the area to be occupied by the recessed portion 8 is preferably as small as possible. The recessed portion 8 shown in FIG. 6 is formed in the rear side of the screen 3 to surround the aperture 3a and has a width w which is suitably about 1 to about 5 mm. If the width is less than 1 mm, the resin will not be effectively prevented from adhering to the rear side, while if it is more than 5 mm, the screen will not retain satisfactory dimensional accuracy, so that widths outside the above range are not suitable.

With reference to FIG. 6, the lower portion of the screen 3 is formed with a peripheral wall 10 having a small thickness and separating the recessed portion 10 from the aperture 3a. The lower end of the peripheral wall 10 comes into substantial line-to-line contact with the surface of the board for screen printing. It is suitable that the peripheral wall 10 be about 0.1 to about 1.0 mm. If less than 0.1 mm, the wall 10 is difficult to form by etching. When having a width larger than 1.0 mm, the wall 10 tends to come into surface-to surface contact with the board and is not desirable.

The line contact portion 7 and the recessed portion 8 therearound need not always be formed by etching but can alternatively be formed by machining or laser beam machining. In this case, the peripheral wall 10 can be made as thin as about 0.02 mm. Further as seen in FIG. 7, an annular member 11 having a triangular cross section may be affixed to the rear side of the screen 3 in register with the aperture 3a. The annular member 11 may be made of the same material as the screen 3 or of a different material. For example, the screen 3 may be made of a metal, and the annular member 11 a plastics material.

As shown in FIG. 8, the aperture 3a can be provided with a porous portion 12 at its upper end. When the aperture 3a has a relatively large diameter, e.g., larger than 20 mm, the porous portion 12 is effective for giving a smooth surface to the filled resin layer. The porous portion 12 need not be provided when the aperture 3a is up to 20 mm in diameter. The opening area of the porous portion 12 is such that the flow of resin to be filled through the aperture 3a by the squeegee will not be impeded and is usually 30 to 70% of the aperture area.

According to the present invention, the liquid sealing resin is forcibly filled into the screen apertures for printing by the operation of the squeegee.

Figure 9A:
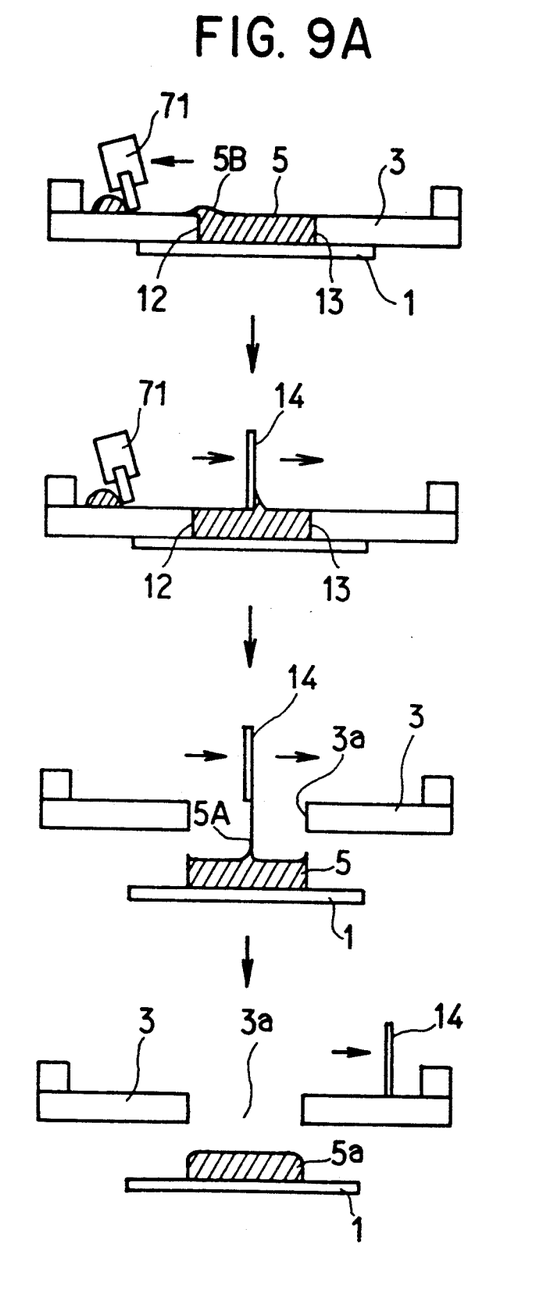
FIG. 9A schematically shows stepwise how a liquid sealing resin is filled into the screen aperture in the sealing method of the invention.
Figure 9B:
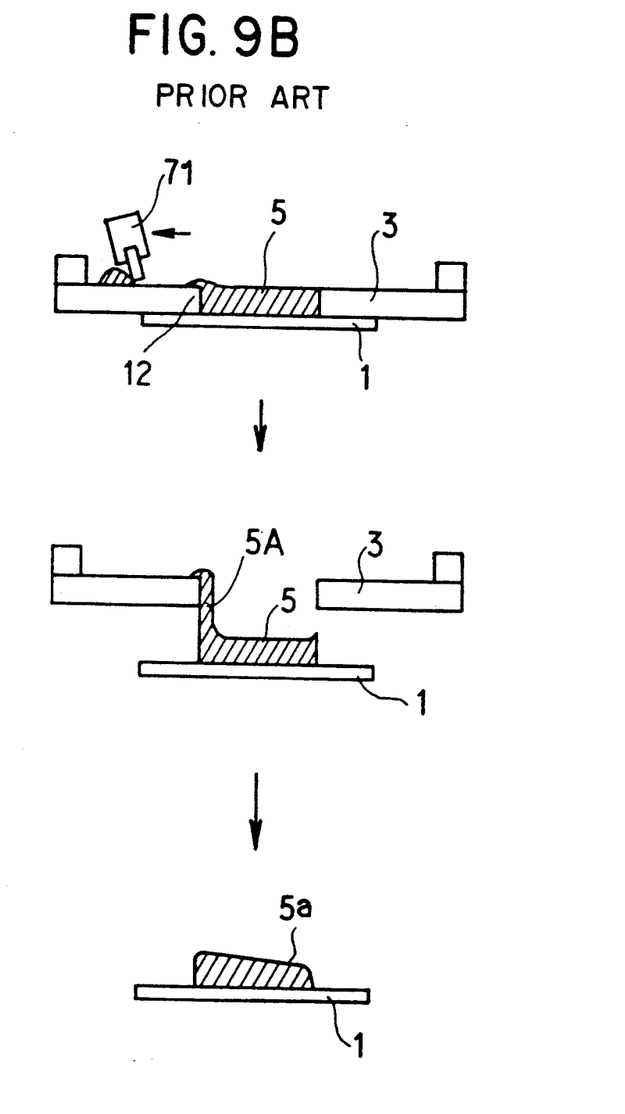
FIG. 9B corresponds to FIG. 9A and illustrates the conventional method.

The upper diagram of FIG. 9B shows the liquid sealing resin 5 immediately after filling. A raised portion is formed toward the end side of stroke of the squeegee 71. Consequently, cobwebbing of the resin 5 occurs at the apertured portion toward the end side when the printing cycle is completed as seen in the middle diagram, and the cobwebbing occurs in an increased amount since the resin is in contact with the screen 3 over a large area. The thread 5A breaks when allowed to stand for a given period of time, whereas the thread in the increased amount takes a longer period of time to break to result in lower productivity. Further since the broken threadlike resin portion is absorbed by the sealing resin layer 5a at one side thereof, the layer 5a becomes no longer uniform in thickness as shown in the lower diagram.

To solve this problem, the countermeasure shown in FIG.9A is taken by the present invention. When the resin 5 is filled by the operation of the squeegee 7, the resin 5 inevitably forms a raised portion 5B toward the end side of stroke of the squeegee insofar as it is moved in the usual manner as shown in the first diagram of FIG. 9A, so that a doctor knife 14 is moved for cutting from the end side toward the other side subsequent to the filling operation to thereby forcibly return the raised resin portion 5B to the intermediate portion of stroke distance of the squeegee. When the resin portion is thus returned, the aperture becomes filled with the resin 5 substantially uniformly from the end side 12 toward the starting side 13. When the resin is completely transferred from the screen in this state, the resin layer can be separated off the screen smoothly at both the end side and the starting side substantially without cobwebbing at these portions. Although the lower end of the doctor knife 14 produces a thread 5A by contact with the returned resin, the amount of cobwebbing is small because the contact area is small, permitting the thread to break in a short period of time to diminish the waste of time due to cobwebbing, hence improved productivity. Further since the break of the thread occurs at the intermediate portion of the stroke distance, the broken threadlike resin portion is absorbed by the intermediate portion of upper surface of the resin layer 5a, whereupon the resin flows toward both sides to form a substantially flat surface. Thus, the problem of uneven thickness due to the break can also be obviated.

Although the above procedure has been described with respect to one aperture 3a with reference to FIG. 9A for the sake of convenience, the screen 3 has a multiplicity of apertures 3a, for each of which the resin is cut with the doctor knife 14. To cut the resin by a single movement of doctor knives 14 for the apertures, the doctor knives 14 are held to a support member (not shown) therefor and arranged in the same pattern as the aperture pattern.

The electric parts mounted on the surface of the wiring board include those which must be sealed with resin like those exemplified above, and relatively small electric parts which need not be sealed with resin, such as capacitors, resistors, windings or the like.

The latter electric parts may be mounted in place on the board after the former pats have been sealed with resin, whereas it is advantageous from the viewpoint of productivity to mount all the former and latter parts first and thereafter seal the former parts only with resin.

Figure 2B:
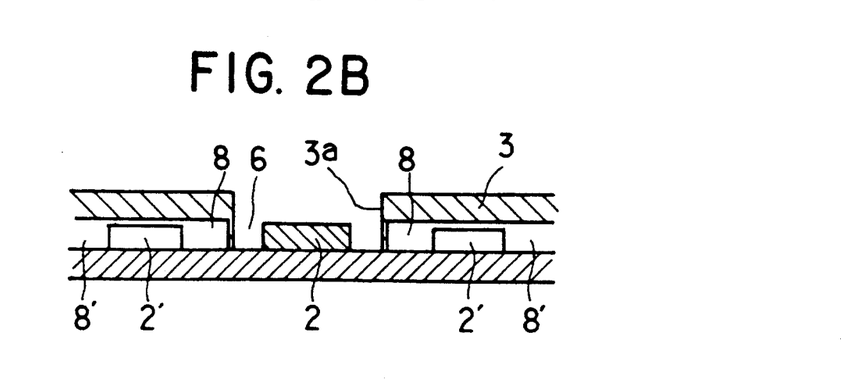
FIG. 2B is an enlarged fragmentary diagram showing a modification of FIG. 2A.

Such mode of sealing can be accomplished by forming the rear side of the screen 3 with cavities 8' in the same pattern as the arrangement of the electric parts 2' which need not be sealed with resin for accommodating these parts 2' as schematically shown in FIG. 2B. In this case, the recessed portion 8 formed around the aperture 3a in the screen 3 for preventing the printing ink from adhering to the rear side can be utilized as a portion of the accommodating cavity 8'.

We claim:

1. A method of sealing electric parts mounted in a bare state on an electric wiring board using a screen having apertures formed by peripheral walls in the same pattern as the electric parts to be sealed wherein lower ends of the peripheral walls are formed with line contact portions surrounded with recesses so as to only come into line-to-line contact with a surface of the electric wiring board, the method comprising the steps of:

positioning the screen in line-to-line contact with the surface of the electric wiring board;

while maintaining said screen in line-to-line contact with said wiring board forcing a sealing resin in a liquid state into the apertures so as to seal the electric parts by using a squeegee moving from a squeegee stroke starting side to a stroke end side of each aperture to fill the apertures with the resin;

while still maintaining said screen in line-to-line contact with said wiring board moving a doctor knife from the squeegee stroke end side over each screen aperture to an intermediate portion of each aperture, subsequent to the operations of the squeegee, for filling each said aperture with the liquid sealing resin, substantially uniformly from the stroke starting side of the aperture to the stroke end side thereof;

retracting the screen from the board while the resin is in a liquid state to complete transfer of the resin from the screen to the board and prevent the resin from migrating to the rear side of said screen; and curing the resin transferred to the board.

2. A method as defined in claim 1 wherein the line contact portion is 0.1 to 1.0 mm in width.

3. A method as defined in claim 1 wherein the recesses formed with the line contact portions are at least 1 mm in width.

4. A method as defined in claim 1 wherein in addition to the electric parts to be sealed with the resin, the board has mounted thereon before sealing electric parts which need not be sealed with the resin, the screen being further formed with cavities to accommodate the electric parts not to be sealed in the rear side of the screen during screen printing.

* * * * *